U\S008900798B2

(12) United States Patent
Savariar-Hauck et al.

(10) Patent No.: US 8,900,798 B2
(45) Date of Patent: *Dec. 2, 2014

(54) ON-PRESS DEVELOPABLE LITHOGRAPHIC PRINTING PLATE PRECURSORS

(75) Inventors: Celin Savariar-Hauck, Badenhausen (DE); Gerhard Hauck, Badenhausen (DE)

(73) Assignee: Eastman Kodak Company, Rochester, NY (US)

( * ) Notice: Subject to any disclaimer, the term of this patent is extended or adjusted under 35 U.S.C. 154(b) by 270 days.

This patent is subject to a terminal disclaimer.

(21) Appl. No.: 12/906,190

(22) Filed: Oct. 18, 2010

(65) Prior Publication Data

US 2012/0094233 A1     Apr. 19, 2012

(51) Int. Cl.
| | |
|---|---|
| G03F 7/00 | (2006.01) |
| G03F 7/26 | (2006.01) |
| B41M 5/00 | (2006.01) |
| B41N 1/08 | (2006.01) |
| B41C 1/10 | (2006.01) |
| G03F 7/30 | (2006.01) |
| G03F 7/031 | (2006.01) |

(52) U.S. Cl.
CPC ............. *G03F 7/031* (2013.01); *B41C 2210/24* (2013.01); *B41C 1/1008* (2013.01); *B41C 2210/266* (2013.01); *B41C 2210/04* (2013.01); *G03F 7/3035* (2013.01); *B41C 2210/22* (2013.01); *B41C 2210/08* (2013.01)
USPC .................... 430/302; 430/270.1; 101/450.1; 101/453; 101/456; 101/457; 101/463.1

(58) Field of Classification Search
None
See application file for complete search history.

(56) References Cited

U.S. PATENT DOCUMENTS

| | | | |
|---|---|---|---|
| 4,425,424 A | 1/1984 | Altland et al. | |
| 4,780,393 A | 10/1988 | Frommeld | |
| 4,940,647 A | 7/1990 | Frommeld et al. | |
| 5,141,839 A | 8/1992 | Mitchell et al. | |
| 5,166,041 A | 11/1992 | Murofushi et al. | |
| 5,665,522 A | 9/1997 | Vogel et al. | |
| 5,759,742 A | 6/1998 | West et al. | |
| 5,852,067 A | 12/1998 | Sukejima et al. | |
| 6,451,491 B1 | 9/2002 | Dhillon et al. | |
| 6,899,994 B2 * | 5/2005 | Huang et al. | ............... 430/271.1 |
| 7,402,374 B2 | 7/2008 | Oohashi et al. | |
| 7,429,445 B1 | 9/2008 | Munnelly et al. | |
| 2002/0168494 A1 | 11/2002 | Nagata et al. | |
| 2003/0068575 A1 | 4/2003 | Yanaka | |
| 2004/0077816 A1 | 4/2004 | Brandstadt et al. | |
| 2005/0170282 A1 | 8/2005 | Inno et al. | |
| 2005/0233251 A1 | 10/2005 | Kakino et al. | |
| 2005/0287466 A1 * | 12/2005 | Miyamoto et al. | ............ 430/141 |
| 2006/0046189 A1 | 3/2006 | Kunita et al. | |
| 2007/0072119 A1 | 3/2007 | Iwai et al. | |
| 2008/0220365 A1 | 9/2008 | Munnelly et al. | |
| 2008/0241754 A1 * | 10/2008 | Hayashi et al. | ............ 430/287.1 |
| 2008/0280228 A1 * | 11/2008 | Hayashi et al. | ............ 430/272.1 |
| 2009/0047599 A1 | 2/2009 | Horne et al. | |
| 2009/0269699 A1 | 10/2009 | Munnelly et al. | |
| 2010/0075260 A1 | 3/2010 | Sasaki | |
| 2010/0209846 A1 | 8/2010 | Strehmel et al. | |
| 2012/0090486 A1 * | 4/2012 | Savariar-Hauck | ............ 101/453 |

FOREIGN PATENT DOCUMENTS

| | | |
|---|---|---|
| EP | 0 251 049 | 1/1988 |
| EP | 0 355 335 | 2/1990 |
| EP | 438123 A2 * | 7/1991 |
| EP | 1 557 262 | 7/2005 |
| EP | 1 614 541 | 1/2006 |
| EP | 1 736 312 | 4/2008 |
| EP | 1 754 614 | 6/2009 |
| JP | 09-244233 | 9/1997 |
| WO | 2005/000598 | 1/2005 |

OTHER PUBLICATIONS

U.S. Appl. No. 12/483,323, filed Jun. 12, 2009 titled Preparing Lithographc Printing Plates With Enhanced Contrast by L. Memetea et al.
U.S. Appl. No. 12/397,429, filed Mar. 4, 2009 titled Imageable Elements With Colorants by C.D. Simpson et al.
U.S. Appl. No. 12/370,625, filed Feb. 13, 2009 titled Negative-Working Imageable Elements by B. Strehmel et al.
U.S. Appl. No. 12/906,228 filed, 18 Oct. 2010 titled "Lithographic Printing Plate Precursors and Methods of Use" by Savariar-Hauck.

* cited by examiner

*Primary Examiner* — Cynthia H Kelly
*Assistant Examiner* — Alyssa L Cepluch
(74) *Attorney, Agent, or Firm* — J. Lanny Tucker

(57) ABSTRACT

On-press developable, negative-working, infrared radiation-sensitive lithographic printing plate precursors have an imageable layer on a substrate. The imageable layer includes a free radically polymerizable component, an initiator composition capable of generating free radicals upon exposure to infrared radiation, a polymeric binder, a first infrared radiation absorbing compound that has a tetraaryl pentadiene chromophore, and a second infrared radiation absorbing compound that is different than the first infrared radiation absorbing compound. The first IR absorbing compound absorbs in both the IR and visible regions of the electromagnetic spectrum and provides coloration for visual inspection of the lithographic printing plates.

15 Claims, No Drawings

ON-PRESS DEVELOPABLE LITHOGRAPHIC PRINTING PLATE PRECURSORS

FIELD OF THE INVENTION

This invention relates to on-press developable lithographic printing plate precursors that exhibit improved printout characteristics. These lithographic printing plate precursors are negative-working elements. This invention also relates to a method of imaging and on-press developing such lithographic printing plate precursors.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink the ink receptive regions accept the ink and repel the water. The ink is then transferred to the surface of suitable materials upon which the image is to be reproduced. In some instances, the ink can be first transferred to an intermediate blanket that in turn is used to transfer the ink to the surface of the materials upon which the image is to be reproduced.

Lithographic printing plate precursors useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer, revealing the underlying hydrophilic surface of the substrate. If the exposed regions are removed, the element is considered as positive-working. Conversely, if the non-exposed regions are removed, the element is considered as negative-working. In each instance, the regions of the imageable layer(s) that remain are ink-receptive, and the regions of the hydrophilic surface revealed by the developing process accept water or aqueous solutions (typically a fountain solution), and repel ink.

"Laser direct imaging" methods (LDI) have been known that directly form an offset printing plate or printing circuit board using digital data from a computer, and provide numerous advantages over the previous processes using masking photographic films. There has been considerable development in this field from more efficient lasers, improved imageable compositions and components thereof.

Various radiation-sensitive compositions are known for use in negative-working lithographic printing plate precursors as described for example in U.S. Pat. No. 6,309,792 (Hauck et al.), U.S. Pat. No. 6,893,797 (Munnelly et al.), U.S. Pat. No. 6,727,281 (Tao et al.), U.S. Pat. No. 6,899,994 (Huang et al.), and U.S. Pat. No. 7,429,445 (Munnelly et al.), U.S. Patent Application Publications 2002/0168494 (Nagata et al.), 2003/0118939 (West et al.), and EP Publications 1,079,276A2 (Lifka et al.) and 1,449,650A2 (Goto et al.).

U.S. Pat. No. 7,429,445 (Munnelly et al.) describes on-press developable negative-working lithographic printing plate precursors that contain various infrared radiation absorbing dyes that have tetraaryl pentadiene chromophores, and nonionic phosphate acrylates to increase imaging sensitivity.

U.S. Patent Application Publication 2010/0075260 (Sasaki) describes a printing plate making method using a plate precursor having a compound that generates an acid light or heat, and the imaged precursor is developed on-press and has color contrast for inspection.

In general, lithographic printing plates contain a colorant (dye or pigment) in the radiation-sensitive composition (imageable layer) that has the function of making the image visible in order to be inspected and evaluated for plate positioning and bar code readability prior to pre-press calibration. Such colorants provide contrast between the image and the background. This image contrast (print out) is particularly needed for printing plate precursors designed for development on-press. However, certain lithographic printing plates cannot contain a colorant for different reasons. For example, the imaged lithographic printing plate precursors that are usually developed on-press have a colorless coating because if a colorant is present, it could contaminate the lithographic printing ink and the fountain solution used for development and printing, with the result of altering the printed color shades. However, sometimes it is necessary for such printing plates to be used the same way as those developed off-press. In such instances, the image needs to be seen and evaluated.

U.S. Pat. No. 6,451,491 (Dhillon et al.) describes the high loading of contrast-providing pigments into the imaging layer using specific poly(vinyl acetal) polymers and specific combinations of loading solvent mixtures. Such high amounts of pigments may not be suitable as they can destabilize imaging chemistry or developers used to remove non-imaged regions in negative-working lithographic printing plate precursors.

Other contrast-providing colorants are obtained from leuco dyes that become colored in the presence of an acid or thermal acid generator, as described for example, in U.S. Pat. No. 7,402,374 (Oohashi et al.), U.S. Pat. No. 7,425,406 (Oshima et al.) and U.S. Pat. No. 7,462,440 (Yamasaki). These imaging materials have some disadvantages because the acid or radical forming mechanism can be triggered prematurely during the drying of the plate leading to un-wanted color, especially in on-press developed printing plates.

Various negative-working imageable elements have been designed for processing or development "on-press" using a fountain solution, lithographic printing ink, or both. For example, such elements are described in U.S. Patent Application Publication 2005-263021 (Mitsumoto et al.) and in U.S. Pat. No. 6,071,675 (Teng), U.S. Pat. No. 6,387,595 (Teng), U.S. Pat. No. 6,482,571 (Teng), U.S. Pat. No. 6,495,310 (Teng), U.S. Pat. No. 6,541,183 (Teng), U.S. Pat. No. 6,548,222 (Teng), U.S. Pat. No. 6,576,401 (Teng), U.S. Pat. No. 6,899,994 (Huang et al.), U.S. Pat. No. 6,902,866 (Teng), and U.S. Pat. No. 7,089,856 (Teng).

U.S. Patent Application Publications 2005/0170282 (Inno et al.), 2005/0233251 (Kakino et al.), 2003/0068575 (Yanaka), 2006/0046189 (Kunita et al.), and 2007/0072119 (Iwai et al.), and EP Publications 1,614,541 (Callant et al.), 1,736,312 (Callant et al.), and 1,754,614 (Kakino et al.) describe lithographic printing plate precursors that contain a discoloring agent or system capable of generating a color change upon exposure for providing print-out.

U.S. Patent Application Publication 2009/0047599 (Horne et al.) describes the use of specific spirolactone or spirolactam leuco dye color formers in the imageable layer of negative-working imageable elements.

U.S. Patent Application Publication 2007/0072119 (Iwai et al.) and EP 1,849,836 (Iwai et al.) describe the use of infrared radiation-sensitive cyanine dyes.

After imaging, printing plates may be inspected to make sure the desired image has been obtained. For lithographic printing plate precursors normally processed (or developed) off-press, this inspection can occur easily before mounting on the printing press. The plate manufacturer often adds a colorant to the imaging composition to facilitate this inspection.

For imaged elements that are to be developed on-press, the image is not easily identified. Adding colorant to on-press developable imaging compositions compromises plate shelf life, on-press developability, or imaging sensitivity, and the colorant may color-contaminate printing press inks. Thus, there is a need for an adequate print-out that provides visibility to the image on the printing plate before on-press development. Simply increasing imaging energy beyond that required for image durability will result in an increase in dot gain. So, the industry needs a different way to improve the print-out without causing other problems.

The invention described in U.S. Patent Application Publication 2009-0269699 (Munnelly et al.) describes the use of IR absorbable dyes to improve color contrast in on-press developable lithographic printing plate precursor.

Copending and commonly assigned U.S. Ser. No. 12/483,323 (filed Jun. 12, 2009 by Memetea, Huang, Munnelly, and Wentz) describes the application of a coloring fluid to the imaged precursor such that the optical density in the solid exposed regions is $OD_2$ that is greater than $OD_1$. This coloring fluid comprises a water-insoluble colorant and a solvent that is capable of swelling the solid exposed regions of the imageable layer.

Copending and commonly assigned U.S. Ser. No. 12/397,429 (filed Mar. 4, 2009 by Simpson, Baumann, Joachin, and Flugel) describes the use of a visible pigment and dye mixture for color contrast.

Copending and commonly assigned U.S. Ser. No. 12/370,625 (filed Feb. 13, 2009 by Strehmel, Baumann, and Lummel) describes the use of water-soluble visible contrast dyes.

Despite all of these improvements to provide image contrast, there remains a need for another improved means for providing contrast between the image and background of lithographic printing plates, especially those prepared from imaged negative-working lithographic printing plate precursors that are developed on-press.

SUMMARY OF THE INVENTION

To address the problem noted above, this invention provides an on-press developable, negative-working, infrared radiation-sensitive lithographic printing plate precursor comprising a substrate and having thereon an imageable layer comprising:

a free radically polymerizable component, an initiator composition capable of generating free radicals upon exposure to infrared radiation, a polymeric binder, a first infrared radiation absorbing compound that has a tetraaryl pentadiene chromophore, and a second infrared radiation absorbing compound that is different than the first infrared radiation absorbing compound.

This invention also provides a method of making a lithographic printing plate comprising:

A) imagewise exposing a negative-working, infrared radiation-sensitive lithographic printing plate precursor of this invention to imaging infrared radiation to produce exposed and non-exposed regions in the imageable layer, and B) developing the imagewise exposed precursor on-press to remove the non-exposed regions of the imageable layer using a fountain solution, lithographic printing ink, or a combination thereof.

We have found that the present invention provides an advantageous way to increase image contrast between the image of a lithographic printing plate and the background, especially for printing plates obtained from imaged negative-working lithographic printing plates that are developed on-press. Thus, the image can be distinguished from the background to allow for pre-press evaluation.

These advantages are achieved by incorporating certain compounds that absorb both visible and infrared radiation into the imageable layer. While the negative-working lithographic printing plates normally have a single infrared radiation absorbing compound for imaging purposes, the lithographic printing plate precursors of this invention have two different infrared radiation (IR) absorbing compounds, and one of them also absorbs in the visible region and thus provides the color contrast while the other infrared radiation absorbing compound provides the necessary sensitivity in the infrared radiation for image formation. The details of each IR absorbing compound are provided below. The most significant improvements are achieved when the amount of the first infrared radiation absorbing compound is less than the amount of the second infrared radiation absorbing compound, and the amount of the first infrared radiation absorbing compound is 2 weight % of less.

DETAILED DESCRIPTION OF THE INVENTION

Definitions

Unless the context indicates otherwise, when used herein, the terms "lithographic printing plate precursor", "printing plate precursor", and "precursor" are meant to be references to embodiments of the present invention.

In addition, unless the context indicates otherwise, the various components described herein such as "first infrared absorbing compound", "second infrared radiation absorbing compound", "initiator", "co-initiator", "free radically polymerizable component", "polymeric binder", and similar terms also refer to mixtures of such components. Thus, the use of the articles "a", "an", and "the" is not necessarily meant to refer to only a single component.

Moreover, unless otherwise indicated, percentages refer to percents by total dry weight, for example, weight % based on total solids of either an imageable layer or radiation-sensitive composition. Unless otherwise indicated, the percentages can be the same for either the dry imageable layer or the total solids of radiation-sensitive composition.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

As used herein, a "stack" of lithographic printing plate precursors includes two or more of the precursors. Interleaf paper can be present between adjacent precursors, or it can be absent from the stack. Generally, a stack has at least two and more typically from 20 to 1500 lithographic printing plate precursors, or at least 100 of them, or at least 250 and up to 800 of the lithographic printing plate precursors.

Substrates

The substrate used to prepare the lithographic printing plate precursors of this invention comprises a support that can be composed of any material that is conventionally used to prepare lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metalized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that can be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of at least 1.5 and up to and including 5 $g/m^2$. Phosphoric acid anodization generally provides an oxide weight on the surface of at least 1 and up to and including 5 $g/m^2$. When sulfuric acid is used for anodization, higher oxide weight (at least 3 $g/m^2$) can provide longer press life.

The aluminum support can also be treated with, for example, a silicate, dextrin, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support can be treated with a phosphate solution that can further contain an inorganic fluoride (PF).

The thickness of the substrate can be varied but should be sufficient to sustain the wear from printing and thin enough to wrap around a printing form. Useful embodiments include a treated aluminum foil having a thickness of at least 100 μm and up to and including 700 μm.

Negative-Working Lithographic Printing Plate Precursors

The precursors are negative-working, and can be formed by suitable application of a radiation-sensitive composition as described below to a suitable substrate (described above) to form an imageable layer. This substrate can be treated or coated in various ways as described above prior to application of the radiation-sensitive composition to improve hydrophilicity. There is only a single imageable layer comprising the radiation-sensitive composition and it is the outermost layer in the element. No oxygen barrier or topcoat is present in the lithographic printing plate precursors.

Negative-working lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), U.S. Pat. No. 4,511,645 (Koike et al.), U.S. Pat. No. 6,027,857 (Teng), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Shrehmel et al.), and U.S. Pat. No. 7,672,241 (Munnelly et al.), and U.S. Patent Application Publications 2003/0064318 (Huang et al.), 2004/0265736 (Aoshima et al.), 2005/0266349 (Van Damme et al.), and 2006/0019200 (Vermeersch et al.). Other negative-working compositions and elements are described for example in U.S. Pat. No. 6,232,038 (Takasaki), U.S. Pat. No. 6,627,380 (Saito et al.), U.S. Pat. No. 6,514,657 (Sakurai et al.), U.S. Pat. No. 6,808,857 (Miyamoto et al.), and U.S. Patent Publication 2009/0092923 (Hayashi).

The radiation-sensitive compositions and imageable layers used in such precursors generally include one or more polymeric binders that facilitate the on-press developability of the imaged precursors. Such polymeric binders include but are not limited to, those that are not generally crosslinkable and are usually present at least partially as discrete particles (not-agglomerated). Such polymers can be present as discrete particles having an average particle size of at least 10 and up to and including 500 nm, and typically at least 100 and up to and including 450 nm, and that are generally distributed uniformly within that layer. The particulate polymeric binders exist at room temperature as discrete particles, for example in an aqueous dispersion. Such polymeric binders generally have a molecular weight ($M_n$) of at least 5,000 and typically at least 20,000 and up to and including 100,000, or at least 30,000 and up to and including 80,000, as determined by Gel Permeation Chromatography.

Useful particulate polymeric binders generally include polymeric emulsions or dispersions of polymers having hydrophobic backbones to which are directly or indirectly linked pendant poly(alkylene oxide) side chains (for example at least 10 alkylene glycol units), cyano side chains, or both, that are described for example in U.S. Pat. No. 6,582,882 (Pappas et al.), U.S. Pat. No. 6,899,994 (Huang et al.), U.S. Pat. No. 7,005,234 (Hoshi et al.), and U.S. Pat. No. 7,368,215 (Munnelly et al.) and US Patent Application Publication 2005/0003285 (Hayashi et al.). More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, in random fashion, attached to the polymer backbone, and various hydrophilic polymeric binders that may have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate polymeric binders can also have a backbone comprising multiple (at least two) urethane moieties. Such polymeric binders generally have a molecular weight ($M_n$) of at least 2,000 and typically at least 100,000 and up to and including 500,000, or at least 100,000 and up to and including 300,000, as determined by dynamic light scattering.

Additional useful polymeric binders are particulate poly (urethane-acrylic) hybrids that are distributed (usually uniformly) throughout the imageable layer. Each of these hybrids has a molecular weight of at least 50,000 and up to and including 500,000 and the particles have an average particle size of at least 10 and up to and including 10,000 nm (typically at least 30 and up to and including 500 nm or at least 30 and up to and including 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that may also include commercial surfactants, anti-foaming agents, dispersing agents, anti-corrosive agents, and optionally pigments and water-miscible organic solvents.

These polymeric binders are generally present in an amount of at least 5 and up to and including 70 weight % of the radiation-sensitive composition.

The radiation-sensitive composition can include a secondary polymeric binder that can be homogenous, that is, non-particulate or dissolved in the coating solvent, or they may exist as discrete particles. Such secondary polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893, 797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.), both patents incorporated herein by reference. Random copolymers of polyethylene glycol methacrylate/acrylonitrile/styrene in particulate form, dissolved random copolymers derived from carboxyphenyl methacrylamide/acrylonitrile/-methacrylamide/N-phenyl maleimide, random copolymers derived from polyethylene glycol methacrylate/acrylonitrile/vinyl carbazole/styrene/-methacrylic acid, random copolymers derived from N-phenyl maleimide/methacrylamide/methacrylic acid, random copolymers derived from urethane-acrylic intermediate A (the reaction product of p-toluene sulfonyl isocyanate and hydroxylethyl methacrylate)/acrylonitrile/N-phenyl maleimide, and random copolymers derived from N-methoxymethyl methacrylamide/methacrylic acid/acrylonitrile/n-phenylmaleimide are useful.

The radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or pre-polymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182, 033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.). Other useful free radically polymerizable components include those described in U.S. Patent Application Publication 2009/0142695 (noted above) that include 1H-tetrazole groups.

In addition to, or in place of the free radically polymerizable components described above, the radiation-sensitive composition may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to and including 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

This radiation-sensitive composition also includes an initiator composition that includes one or more initiators that are capable of generating free radicals sufficient to initiate polymerization of all the various free radically polymerizable components upon exposure of the composition to imaging infrared radiation. The initiator composition is responsive, for example, to electromagnetic radiation in the infrared spectral regions, corresponding to the broad spectral range of at least 700 nm and up to and including 1400 nm, and typically radiation of at least 700 nm and up to and including 1250 nm.

More typically, the initiator composition includes one or more an electron acceptors and one or more co-initiators that are capable of donating electrons, hydrogen atoms, or a hydrocarbon radical.

In general, suitable initiator compositions for IR-radiation sensitive compositions comprise initiators that include but are not limited to, aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts).

Useful initiator compositions for IR radiation sensitive compositions include onium compounds including ammonium, sulfonium, iodonium, and phosphonium compounds. Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged counterion.

Thus, the iodonium cations can be supplied as part of one or more iodonium salts, and the iodonium cations can be supplied as iodonium borates also containing suitable boron-containing anions. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.).

Useful IR radiation-sensitive initiator compositions can comprise one or more diaryliodonium borate compounds. Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexyl-phenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl) phenyl]borate, 4-methoxyphenyl-4'-cyclohexyl-phenyliodonium tetrakis(penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis (4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The imageable layers comprise a radiation-sensitive imaging composition that includes first and second infrared radiation absorbing compounds.

The first infrared radiation absorbing compounds are sensitive to both infrared radiation (typically of at least 700 and up to and including 1400 nm) and visible radiation (typically of at least 450 and up to and including 700 nm). These compounds also have a tetraaryl pentadiene chromophore. Such chromophore generally includes a pentadiene linking group having 5 carbon atoms in the chain, to which are attached two substituted or unsubstituted aryl groups at each end of the linking group. These aryl groups can be substituted with the same or different tertiary amine groups. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain. For example, useful first infrared radiation absorbing compounds can be represented by the following Structure (DYE-I)

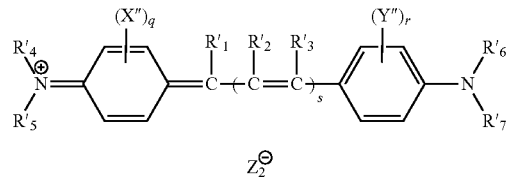

DYE I wherein $R_1'$, $R_2'$, and $R_3'$ each independently represents hydrogen, or a halo, cyano, alkoxy, aryloxy, acyloxy, carbamoyl, acyl, acylamido, alkylamino, arylamino, alkyl, aryl, or heteroaryl group, or any two of $R_1'$, $R_2'$, and $R_3'$ groups may be joined together or with an adjacent aromatic ring to complete a 5- to 7-membered carbocyclic or heterocyclic ring, $R_4'$, $R_5'$, $R_6'$, and $R_7'$ each independently represents hydrogen, an alkyl group having 1 to 8 carbon atoms, a cycloalkyl group having 4 to 6 carbon atoms in the ring, an aryl group having 6 to 10 carbon atoms in the ring, or a heteroaryl group having 5 to 10 carbon and heteroatoms in the ring, or $R_4'$ and $R_5'$ or $R_6'$ and $R_7'$ can be joined together to form a 5- to 9-membered heterocyclic ring, or $R_4'$, $R_5'$, $R_6'$, or $R_7'$ can be joined to a carbon atom of an adjacent aromatic ring at a position ortho to the position of attachment of the anilino nitrogen to form, along with the nitrogen to which they are attached, a 5- or 6-membered heterocyclic ring, s is 2, $Z_2$ is a monovalent anion, X" and Y" are independently $R_1'$ or the atoms necessary to complete a 5- to 7-membered fused carbocyclic or heterocyclic ring, and q and r are independently integers of from 1 to 4.

In Structure (DYE-I), $Z_2^-$ is a suitable counterion that may be derived from a strong acid, and include such anions as $ClO_4^-$, $BF_4^-$, $CF_3SO_3^-$, $PF_6^-$, $AsF_6^-$, $SbF_6^-$, and perfluoroethylcyclohexylsulfonate. Other cations include boron-containing anions as described above (borates), methylbenzenesulfonic acid, benzenesulfonic acid, methanesulfonic acid, p-hydroxybenzenesulfonic acid, p-chlorobenzenesulfonic acid, tosylate, and halides. Particularly useful counterions are alkyltriphenyl borate anions.

In some embodiments, the first infrared radiation absorbing compound is represented by the following Structure (DYE-II) or (DYE-III):

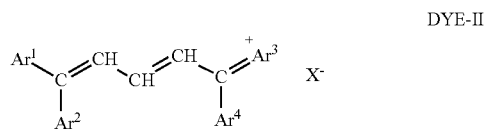

DYE-II wherein $Ar^1$ through $Ar^4$ are the same or different aryl groups wherein at least one and up to three of the aryl groups are substituted with a tertiary amino group, and $X^-$ is a counterion (as described above for $Z_2^-$),

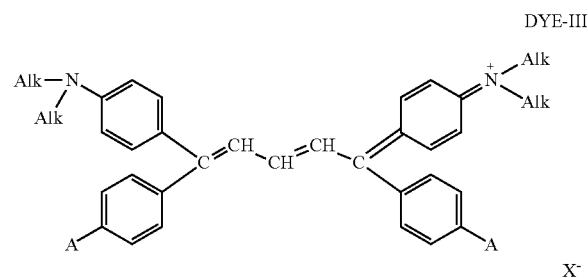

DYE-III wherein Alk represents the same or different alkyl groups having 1 to 7 carbon atoms, A represents hydrogen or the same or different substituted or unsubstituted lower alkyl group having 1 to 3 carbon atoms or the same or different dialkylamino groups, and $X^-$ is a counterion (as described above for $Z_2^-$).

Examples of useful first infrared radiation absorbing compounds include the following compounds that can also be used in a mixture:

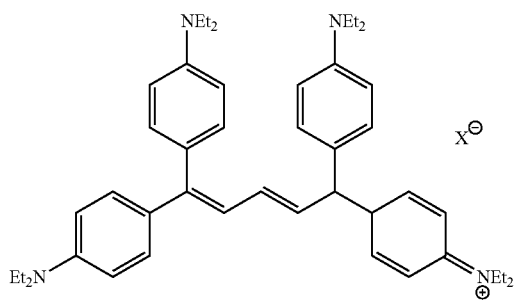

$X^-$ is tosylate or an alkyltriphenylborate.

The first infrared radiation absorbing compound is generally present in an amount of up to and including 2 weight %, or at least 0.2 and up to and including 2 weight %, or more typically at least 0.4 and up to and including 1.5, all based on the total solids of the imageable layer.

The amount of the first infrared radiation absorbing compound in the imageable layer is less than the amount of the second infrared radiation absorbing compound. For example, the molar ratio of the first infrared radiation absorbing compound to the second infrared radiation absorbing compound (described below) is at least 1:1.5 and up to and including 1:6, or more likely at least 1:2 and up to and including 1:4.

The second infrared radiation (IR) absorbing compound can be any known IR absorbing compound as long as it is different than the first infrared radiation absorbing compound. The second infrared radiation absorbing compounds are to infrared radiation (typically of at least 700 and up to and including 1400 nm) but are not particularly sensitive to visible radiation (typically of at least 450 and up to and including 700 nm). For example, useful second IR absorbing compounds can include various IR-sensitive dyes ("IR dyes"). Examples of suitable second IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes having IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Useful IR-radiation sensitive compositions are described, for example, in the following patent, publications, and copending patent applications:

U.S. Pat. No. 7,452,638 (Yu et al.),
U.S. Patent Application Publication 2008/0254387 (Yu et al.),
U.S. Patent Application Publication 2008/0311520 (Yu et al.),
U.S. Patent Application Publication 2009/0263746 (Ray et al.), and
U.S. Patent Application Publication 2010/0021844 (Yu et al.).

The second infrared radiation absorbing compounds can be present in the radiation sensitive composition (or imageable layer) in an amount generally of at least 0.5% and up to and including 10% and typically at least 1% and up to and including 6%, based on dry weight of the imageable layer.

The imageable layer can also include a "primary additive" that is a poly(alkylene glycol) or an ether or ester thereof that has a molecular weight of at least 200 and up to and including 4000. Useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate.

The imageable layer can further include a "secondary additive" that is a poly(vinyl alcohol), a poly(vinyl pyrrolidone), poly(vinyl imidazole), or polyester in an amount of up to and including 20 weight % based on the total dry weight of the imageable layer.

Additional additives to the imageable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.). The imageable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts.

The radiation-sensitive composition and imageable layer does not contain a phosphate (meth)acrylate having a molecular weight generally greater than 250 as described in U.S. Pat. No. 7,429,445 (Munnelly et al.). By "phosphate (meth)acrylate" we also mean "phosphate methacrylates" and other derivatives having substituents on the vinyl group in the acrylate moiety.

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied and dried to form an outermost imageable layer.

Illustrative of such manufacturing methods is mixing the various components needed for a specific imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Invention Examples below. After proper drying, the coating weight of the imageable layer is generally at least 0.1 and up to and including 5 $g/m^2$ or at least 0.5 and up to and including 3.5 $g/m^2$.

Layers can also be present under the imageable layer to enhance developability or to act as a thermal insulating layer.

The lithographic printing plate precursor does not include a water-soluble or water-dispersible overcoat (also sometimes known as an "oxygen impermeable topcoat" or "oxygen barrier layer") disposed over the imageable or radiation-sensitive layer.

Once the various layers have been applied and dried on the substrate, the negative-working imageable elements can be enclosed in water-impermeable material that substantially inhibits the transfer of moisture to and from the element and "heat conditioned" as described in U.S. Pat. No. 7,175,969 (noted above).

The lithographic printing plate precursors can be stored and transported as stacks of precursors within suitable packaging and containers known in the art.

Imaging Conditions

During use, the lithographic printing plate is exposed to a suitable source of exposing radiation depending upon the second infrared radiation absorbing compound present in the radiation-sensitive composition to provide specific sensitivity that is at a wavelength of at least 700 and up to and including 1400 nm, or at least 750 and up to and including 1250 nm.

For example, imaging can be carried out using imaging or exposing radiation from an infrared laser (or array of lasers) at a wavelength of at least 750 nm and up to and including about 1400 nm and typically at least 750 nm and up to and including 1250 nm. Imaging can be carried out using imaging radiation at multiple wavelengths at the same time if desired.

The laser used to expose the lithographic printing plate precursor is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can be configured as a flatbed recorder or as a drum recorder, with the lithographic printing plate precursor mounted to the interior or exterior cylindrical surface of the drum. An example of an useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.).

Imaging with infrared radiation can be carried out generally at imaging energies of at least 30 $mJ/cm^2$ and up to and including 500 $mJ/cm^2$, and typically at least 50 and up to and including 300 $mJ/cm^2$ depending upon the sensitivity of the imageable layer.

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

With or without a post-exposure baking step after imaging and before development, the imaged lithographic printing plate precursors are developed "on-press" as described in more detail below. In most embodiments, a post-exposure baking step is omitted. On-press development avoids the use of alkaline developing solutions typically used in conventional processing apparatus. The imaged precursor is mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The fountain solution is taken up by the non-imaged regions, that is, the surface of the hydrophilic substrate revealed by the imaging and development steps, and ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged precursor to the receiving material. The imaged precursors can be cleaned between impressions, if desired, using conventional cleaning means.

The presence of the first infrared radiation absorbing compound, which also has absorbance in the visible region of the electromagnetic spectrum, allows for visual inspection of the lithographic printing plate at any time.

The present invention provides at least the following embodiments and combinations thereof, but other combinations of features are considered to be within the present invention as a skilled artisan would appreciate from the teaching of this disclosure:

1. An on-press developable, negative-working, infrared radiation-sensitive lithographic printing plate precursor comprising a substrate and having thereon an imageable layer comprising:
   a free radically polymerizable component,
   an initiator composition capable of generating free radicals upon exposure to infrared radiation,
   a polymeric binder,
   a first infrared radiation absorbing compound that has a tetraaryl pentadiene chromophore, and
   a second infrared radiation absorbing compound that is different than the first infrared radiation absorbing compound.

2. The lithographic printing plate precursor of embodiment 1 wherein the first infrared radiation absorbing compound is present in an amount of up to 2 weight % of the total solids of the imageable layer, and the first infrared radiation absorbing compound is present in an amount that is less than the amount of the second infrared radiation absorbing compound.

3. The lithographic printing plate precursor of embodiment 1 or 2 wherein the second infrared radiation absorbing compound is present in an amount of at least 0.5 and up to and including 10 weight % of the total solids of the imageable layer.

4. The lithographic printing plate precursor of any of embodiments 1 to 3 wherein the molar ratio of the first infrared radiation absorbing compound to the second radiation absorbing compound is at least 1:1.5 and up to and including 1:8.

5. The lithographic printing plate precursor of any of embodiments 1 to 4 from which a nonionic phosphate acrylate having a molecular weight of at least 250, is excluded.

6. The lithographic printing plate precursor of any of embodiments 1 to 5 wherein the first infrared radiation absorbing compound is an infrared radiation absorbing dye that is represented by the following Structure DYE-I, DYE-II, or DYE-III:

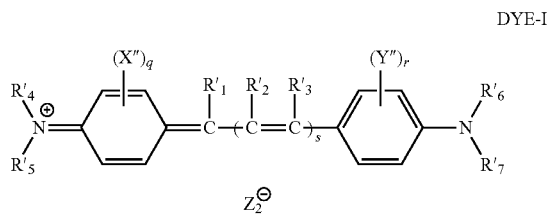

DYE-I wherein $R_1'$, $R_2'$, and $R_3'$ each independently represents hydrogen, or a halo, cyano, alkoxy, aryloxy, acyloxy, carbamoyl, acyl, acylamido, alkylamino, arylamino, alkyl, aryl, or heteroaryl group, or any two of $R_1'$, $R_2'$, and $R_3'$ groups may be joined together or with an adjacent aromatic ring to complete a 5- to 7-membered carbocyclic or heterocyclic ring, $R_4'$, $R_5'$, $R_6'$, and $R_7'$ each independently represents hydrogen, an alkyl group having 1 to 8 carbon atoms, a cycloalkyl group having 4 to 6 carbon atoms in the ring, an aryl group having 6 to 10 carbon atoms in the ring, or a heteroaryl group having 5 to 10 carbon and heteroatoms in the ring, or $R_4'$ and $R_5'$ or $R_6'$ and $R_7'$ can be joined together to form a 5- to 9-membered heterocyclic ring, or $R_4'$, $R_5'$, $R_6'$, or $R_7'$ can be joined to a carbon atom of an adjacent aromatic ring at a position ortho to the position of attachment of the anilino nitrogen to form, along with the nitrogen to which they are attached, a 5- or 6-membered heterocyclic ring, s is 2, $Z_2$ is a monovalent anion, X" and Y" are independently $R_1'$ or the atoms necessary to complete a 5- to 7-membered fused carbocyclic or heterocyclic ring, and q and r are independently integers of from 1 to 4,

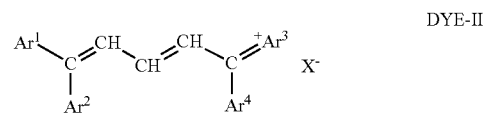

DYE-II wherein $Ar^1$ through $Ar^4$ are the same or different aryl groups wherein at least one and up to three of the aryl groups are substituted with a tertiary amino group, and $X^-$ is a counterion,

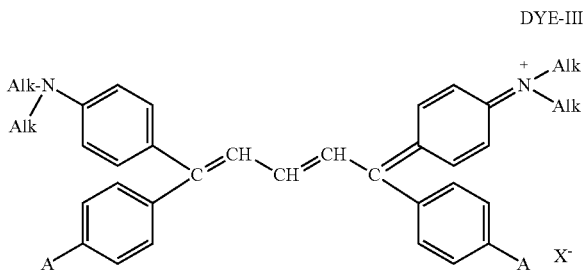

DYE-III wherein Alk represents the same or different alkyl groups having 1 to 7 carbon atoms, A represents hydrogen or the same or different substituted or unsubstituted lower alkyl group having 1 to 3 carbon atoms or the same or different dialkylamino groups, and X⁻ is a counterion.

7. The lithographic printing plate precursor of embodiment 6 wherein at least two of the aryl groups at different ends of the first infrared radiation absorbing compound molecule are substituted with the same or different tertiary amino groups.

8. The lithographic printing plate precursor of embodiment 6 or 7 wherein the X⁻ counterion is an alkyltriphenyl boron anion.

9. The lithographic printing plate precursor of any of embodiments 6 to 8 wherein the X⁻ counterion is a tosylate anion.

10. The lithographic printing plate precursor of any of embodiments 1 to 9 wherein the first infrared radiation absorbing compound includes one or more of the following compounds:

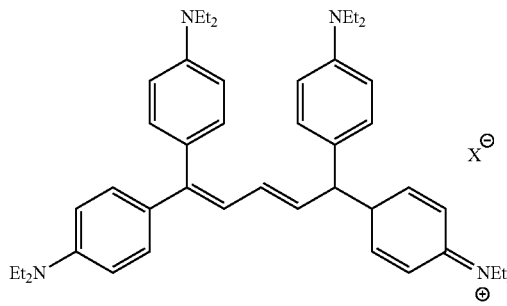

wherein X⁻ is tosylate or an alkyltriphenylborate.

11. The lithographic printing plate precursor of any of embodiments 1 to 10 wherein the polymeric binder comprises a polymer backbone to which are directly or indirectly linked poly(alkylene glycol) side chains.

12. The lithographic printing plate precursor of any of embodiments 1 to 11 wherein the polymeric binder has a polymer backbone to which are attached poly(alkylene glycol) side chains that contain at least 10 alkylene glycol units, and cyano side chains.

13. The lithographic printing plate precursor of any of embodiments 1 to 12 wherein the polymeric binder is present at least partially as discrete particles.

14. The lithographic printing plate precursor of any of embodiments 1 to 13 wherein the initiator composition comprises an electron acceptor and a co-initiator that is capable of donating electrons, hydrogen atoms, or a hydrocarbon radical.

15. The lithographic printing plate precursor of any of embodiments 1 to 14 wherein the second infrared radiation absorbing compound is an infrared radiation absorbing dye that effectively absorbs infrared radiation at a wavelength of at least 700 and up to and including 1400 nm.

16. A method of making a lithographic printing plate comprising:

A) imagewise exposing the negative-working, infrared radiation-sensitive lithographic printing plate precursor of any of embodiments 1 to 15 to imaging infrared radiation to produce exposed and non-exposed regions in the imageable layer, and B) developing the imagewise exposed precursor on-press to remove the non-exposed regions of the imageable layer using a fountain solution, lithographic printing ink, or a combination thereof.

The following Examples are provided to illustrate the practice of this invention and are not meant to be limiting in any manner.

The components and materials used in the examples were as follows:

Byk® 336 surfactant was obtained from Byk Chemie (Wallingford, Conn.). Copolymer A Latex polymer derived from poly(ethylene glycol) methacrylate:acrylonitrile:styrene at 10:70:20 (Binder-dispersion with 24% solids) in 80:20 propanol:water (Binder).

Klucel® M is a hydroxypropyl cellulose that was obtained from Hercules Inc. (Wilmington, Del.).

Elvacite® 4026 is a solid acrylic particulate resin.

IB05 is bis-(4-t-butylphenyl)iodonium tetraphenylborate.

IR Dye 1 that is a first infrared radiation absorbing compound for the present invention is available from Showa Denko (Tokyo, Japan) and has the structure

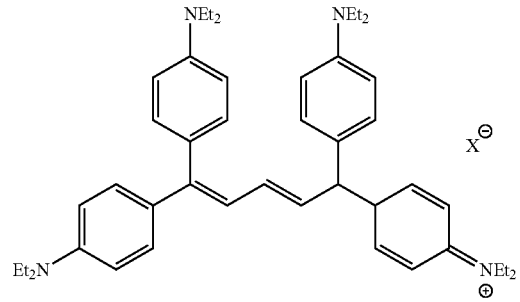

wherein X⁻ is tosylate.

S2024 is an IR Dye with the following structure that is available from FEW Chemicals Germany.

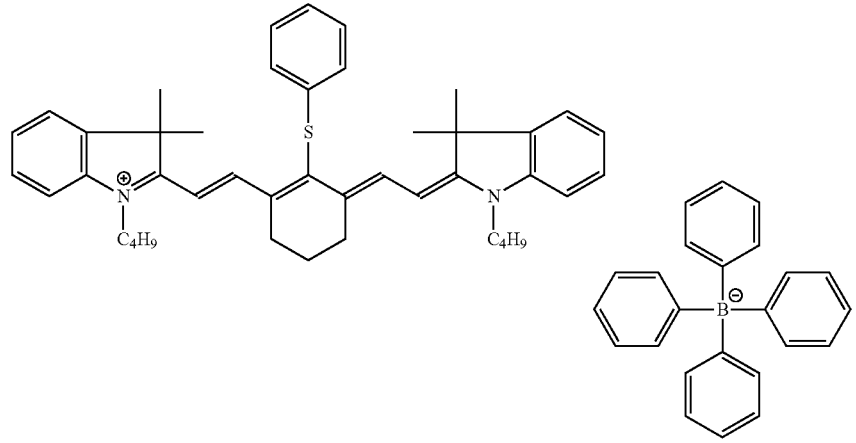

S2190 is an IR Dye with the following structure that is available from FEW Chemicals, Germany

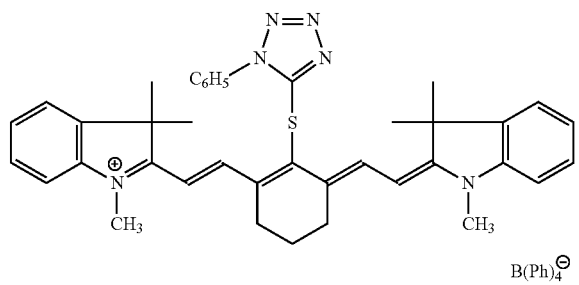

KAN 052545 has the following structure:

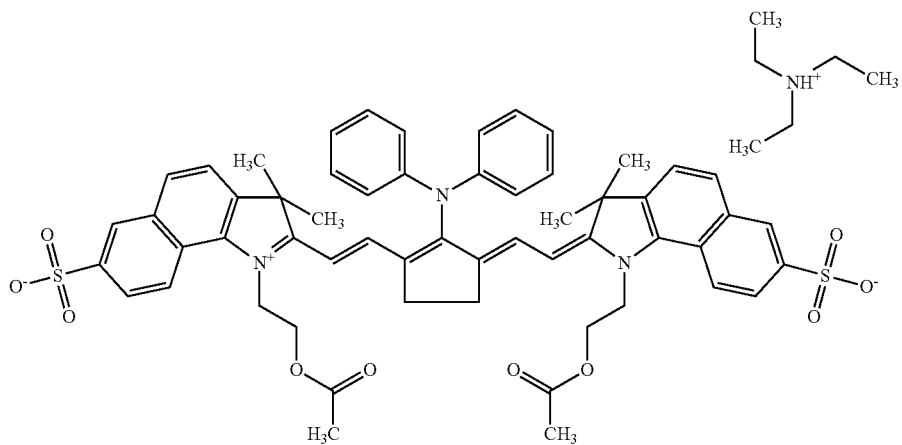

SR399 is dipentaerythritol pentaacrylate that is available from Sartomer.
Oligomer A was a urethane acrylate prepared by reacting Desmodur® N100 (an aliphatic polyisocyanate resin based on hexamethylene diisocyanate from Bayer Corp., Milford, Conn.) with hydroxyethyl acrylate and pentaerythritol triacrylate (80 wt. % in 2-butanone).
MEK represents methyl ethyl ketone.
Dowanol® PM is propylene glycol methyl ether that can be obtained from Dow Chemical Company. It is also known in the art as PGME.
BLO represents γ-butyrolactone.
Surfactant 10G is a nonionic surfactant that is available from Dixie Chemicals, USA.
Substrate 1 is an electrochemically-grained and sulfuric acid-anodized aluminum support, with an oxide weight of 3.8 g/m² that had been post-treated with Solution A that is a 0.5 weight % solution containing polyacrylic acid (weight average molecular weight of about 5000), phosphoric acid, and Surfactant 10G in a weight ratio of 71.9:21.6:6.5. The post-treatment was done by first heating Solution A to 60° C. and then coating the heated Solution A using a bar coater to give a wet film of 21 g/m². After a dwell time of 10 seconds, the substrate was rinsed and dried for 2 minutes at 70° C.
Substrate 2 was obtained similarly to Substrate 1 except that Solution B was used, which was a 0.5 weight % of poly(vinyl phosphonic acid).

Invention Examples 1-5 and Comparative Examples 1-4

Lithographic printing plate precursors were prepared by coating each of the imageable layer formulations shown in the following TABLE I (by parts) onto Substrate 1, to provide a dry coating weight of 1.0 g/m². The imageable layer formulation was applied using a bar coater and dried for 60 seconds for about 82° C.

TABLE I

| | Invention Example 1 | Invention Example 2 | Invention Example 3 | Invention Example 4 | Invention Example 5 | Comparative Example 1 | Comparative Example 2 | Comparative Example 3 | Comparative Example 4 |
|---|---|---|---|---|---|---|---|---|---|
| n-Propanol | 16.8 | 16.8 | 16.8 | 16.8 | 16.8 | 16.8 | 16.8 | 16.8 | 16.8 |
| MEK | 6.7 | 6.7 | 6.7 | 6.8 | 6.8 | 6.7 | 6.7 | 6.7 | 6.8 |
| Dowanol ® PM | 14.3 | 14.3 | 14.3 | 14.3 | 14.3 | 14.3 | 14.3 | 14.3 | 14.3 |
| Water | 1.4 | 1.4 | 1.4 | 1.5 | 1.5 | 1.4 | 1.4 | 1.4 | 1.5 |
| BLO | 0.5 | 0.5 | 0.5 | 0.5 | 0.5 | 0.5 | 0.5 | 0.5 | 0.5 |
| Oligomer A (40% in MEK) | 1.442 | 1.442 | 1.442 | 1.449 | 1.449 | 1.442 | 1.442 | 1.442 | 1.449 |
| SR399 (40% in MEK) | 1.459 | 1.459 | 1.459 | 1.466 | 1.466 | 1.459 | 1.459 | 1.459 | 1.466 |
| Klucel M (1% in water) | 2.403 | 2.403 | 2.403 | 2.300 | 2.300 | 2.403 | 2.403 | 2.403 | 2.300 |
| Elvacite ® 4026 (10% in MEK) | 1.202 | 1.202 | 1.202 | 1.150 | 1.150 | 1.202 | 1.202 | 1.202 | 1.150 |
| IB05 | 0.120 | 0.120 | 0.120 | 0.115 | 0.115 | 0.120 | 0.120 | 0.120 | 0.115 |
| IR Dye 1 | 0.011 | 0.011 | 0.011 | 0.023 | 0.046 | 0 | 0 | 0 | 0.046 |
| S2024 | 0.048 | 0 | 0 | 0 | 0 | 0.048 | 0 | 0 | 0 |
| S2190 | 0 | 0.048 | 0 | 0.046 | 0.046 | 0 | 0.048 | 0 | 0 |
| KAN052545 | 0 | 0 | 0.048 | 0 | 0 | 0 | 0 | 0.048 | 0 |
| Copolymer A Latex | 3.035 | 3.035 | 3.035 | 3.050 | 3.050 | 3.035 | 3.035 | 3.035 | 3.050 |
| $H_3PO_4$ | 0.481 | 0.481 | 0.481 | 0.460 | 0.460 | 0.481 | 0.481 | 0.481 | 0.460 |
| Byk ® 336 (25% in Dowanol ® PM) | 0.054 | 0.054 | 0.054 | 0.052 | 0.052 | 0.054 | 0.054 | 0.054 | 0.052 |

TABLE II

| | Invention Example 1 | Invention Example 2 | Invention Example 3 | Invention Example 4 | Invention Example 5 | Comparative Example 1 | Comparative Example 2 | Comparative Example 3 | Comparative Example 4 |
|---|---|---|---|---|---|---|---|---|---|
| ΔE 150 mJ/cm$^2$ | 3.4 | 6.9 | 1.2 | 4.8 | 6.2 | 1.6 | 1.5 | 0.8 | 7.1 |
| ΔE 300 mJ/cm$^2$ | 5.2 | 9.2 | 3.7 | 7.2 | 9.5 | 1.9 | 2.3 | 2.1 | 11.1 |
| DOP | 13 | 18 | 11 | 9 | 17 | 23 | 21 | 20 | 14 |
| DOP-INK | 2 | 2 | 2 | 2 | 2 | 2 | 2 | 2 | 2 |

The resulting lithographic printing plate precursors were exposed at 50 to 300 mJ/cm$^2$ using a Kodak® Trendsetter 3244× imagesetter at 7.2 W. The change in the color density is given by the ΔE value that was calculated using the known L, a, b values of the non-exposed regions (L1,a1,b1) and the exposed regions (L2,a2,b2) at 150 mJ/cm$^2$ and 300 mJ/cm$^2$. The ΔE was calculated as follows: $[(L1-L2)^2 (a1-a2)^2+(b1-b2)^2]^{1/2}$. The higher the ΔE value, the better is the printout.

The ΔE values exhibited by the formulations shown in TABLE I are given in TABLE II. To check the printing press properties, the imaged lithographic printing plate precursors shown in TABLE I were directly mounted after imaging onto a MAN Roland 04 press charged with Cora S 8900 Hartmann Black lithographic ink and Sinal 5% in Wasser fountain solution. The printing press was started and the dampening system was engaged to wet the printing plates with fountain solution. After five revolutions, the inking system was engaged and after another 5 revolutions with inking, 200 copies of the image were printed. The printed sheets were assessed for the number of sheets needed to print a clean background (DOP), the number of sheets needed to get to full ink density (DOP-INK), and general image quality of the solids and screen areas at 300 mJ/cm$^2$ exposure. The results are given in TABLE II above. Printing was continued to produce 20,000 copies of good quality before the test was discontinued.

Invention Examples 6-7 and Comparative Examples 5-6

The formulations used in Invention Examples 1 and 2 were coated onto samples of Substrate 2 to provide two additional lithographic printing plates of this invention (Invention Example 6 and 7, respectively). Similarly, the formulations used in Comparative Examples 1 and 2 were coated onto samples of Substrate 2 to provide lithographic printing plate precursors of Comparative Examples 5 and 6, respectively. All of the imaged precursors were mounted onto the printing press, printed, and evaluated as described above in Invention Example 1 and the results as shown below in TABLE III.

TABLE III

| Printing Properties | Invention Example 5 | Invention Example 6 | Comparative Example 5 | Comparative Example 6 |
|---|---|---|---|---|
| ΔE 150 mJ/cm$^2$ | 2.7 | 4.2 | 1.5 | 1.8 |
| ΔE 300 mJ/cm$^2$ | 3.7 | 5.7 | 2.3 | 2.3 |
| DOP | 1 | 1 | 1 | 1 |
| DOP-INK | 2 | 2 | 2 | 2 |

All the lithographic printing plates prepared in Invention Examples 1 to 7 and in Comparative Examples 1-6 were used to print a clean copy within 25 initial sheets, a good ink roll-up, and a run length without any wear in the solids or the 2% dots up to the end of the press runs of 20,000 copies except in the case of Comparative Example 4 that contained only IR Dye 1 and that exhibited loss of highlights after 5,000 copies.

The ΔE values, however, show that only the lithographic printing plates prepared according to the present invention, containing the specific IRT dye, gave good printout.

The invention has been described in detail with particular reference to certain preferred embodiments thereof, but it will be understood that variations and modifications can be effected within the spirit and scope of the invention.

The invention claimed is:

1. An on-press developable, negative-working, infrared radiation-sensitive lithographic printing plate precursor comprising a substrate and having thereon an imageable layer comprising:
a free radically polymerizable component,
an initiator composition capable of generating free radicals upon exposure to infrared radiation, which initiator composition comprises an electron acceptor and a co-initiator that is capable of donating electrons,
a polymeric binder,
a first infrared radiation absorbing compound that has a tetraaryl pentadiene chromophore, and
a second infrared radiation absorbing compound that is different than the first infrared radiation absorbing compound,
wherein the first infrared radiation absorbing compound is an infrared radiation absorbing dye that is represented by the following Structure DYE-III:

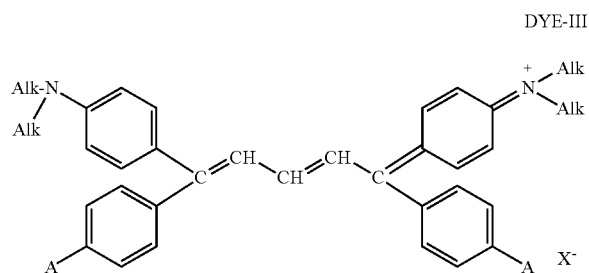

DYE-III wherein Alk represents the same or different alkyl groups having 1 to 7 carbon atoms, A represents hydrogen or the same or different substituted or unsubstituted lower alkyl group having 1 to 3 carbon atoms or the same or different dialkylamino groups, and $X^-$ is a counterion, and
wherein the molar ratio of the first infrared radiation absorbing compound to the second radiation absorbing compound is at least 1:2 and up to and including 1:4.

2. The on-press developable, negative-working infrared radiation-sensitive lithographic printing plate precursor of claim 1 wherein the first infrared radiation absorbing compound is present in an amount of up to 2 weight % of the total solids of the imageable layer.

3. The on-Dress developable, negative-working infrared radiation-sensitive lithographic printing plate precursor of claim 1 wherein the second infrared radiation absorbing compound is present in an amount of at least 0.5 and up to and including 10 weight % of the total solids of the imageable layer.

4. The on-press developable, negative-working infrared radiation-sensitive lithographic printing plate precursor of claim 1 from which a nonionic phosphate acrylate having a molecular weight of at least 250, is excluded.

5. The on-press developable, negative-working infrared radiation-sensitive lithographic printing plate precursor of claim 1 wherein the $X^-$ counterion is an alkyltriphenyl boron anion.

6. The on-press developable, negative-working infrared radiation-sensitive lithographic printing plate precursor of claim 1 wherein the $X^-$ counterion is a tosylate anion.

7. The on-press developable, negative-working infrared radiation-sensitive lithographic printing plate precursor of claim 1 wherein the first infrared radiation absorbing compound includes one or more of the following compounds:

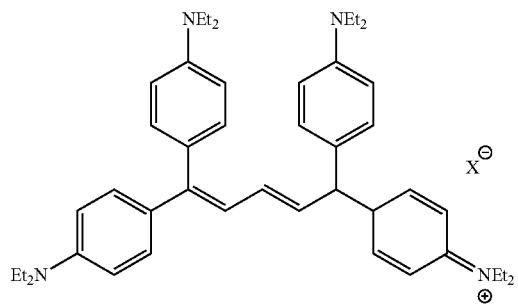

wherein $X^-$ is tosylate or an alkyltriphenylborate.

8. The on-press developable, negative-working infrared radiation-sensitive lithographic printing plate precursor of claim 1 wherein the polymeric binder comprises a polymer backbone to which are directly or indirectly linked poly(alkylene glycol) side chains.

9. The on-press developable, negative-working infrared radiation-sensitive lithographic printing plate precursor of claim 1 wherein the polymeric binder has a polymer backbone to which are attached poly(alkylene glycol) side chains that contain at least 10 alkylene glycol units, and cyano side chains.

10. The on-press developable, negative-working infrared radiation-sensitive lithographic printing plate precursor of claim 1 wherein the polymeric binder is present at least partially as discrete particles.

11. The on-press developable, negative-working infrared radiation-sensitive lithographic printing plate precursor of claim 1 wherein the second infrared radiation absorbing compound is an infrared radiation absorbing dye that effectively absorbs infrared radiation at a wavelength of at least 700 and up to and including 1400 nm.

12. The on-press developable, negative-working infrared radiation-sensitive lithographic printing plate precursor of claim 1, wherein the first infrared radiation absorbing compound is present in an amount of at least 0.2 weight % and up to and including 1.5 weight % of the total solids of the imageable layer.

13. A method of making a lithographic printing plate comprising:
A) imagewise exposing the on-press developable, negative-working, infrared radiation-sensitive lithographic printing plate precursor of claim 1 to imaging infrared radiation to produce exposed and non-exposed regions in the imageable layer in an imagewise exposed precursor, and
B) developing the imagewise exposed precursor on-press to remove the non-exposed regions of the imageable layer using a fountain solution, lithographic printing ink, or a combination thereof.

14. The method of claim 13 wherein the on-press developable, negative-working infrared radiation-sensitive lithographic printing plate precursor contains the first infrared radiation absorbing compound in an amount of up to 2 weight % of the total solids of the imageable layer.

15. The method of claim 13 wherein the $X^-$ counterion is an alkyltriphenyl boron anion, or a tosylate anion.

* * * * *